(12) United States Patent  (10) Patent No.: US 11,428,741 B2
Chen et al.  (45) Date of Patent: Aug. 30, 2022

(54) METHOD AND DEVICE FOR ESTIMATING OPEN CIRCUIT VOLTAGE OF BATTERY BASED ON A GAS-LIQUID DYNAMIC MODEL

(71) Applicant: JIANGSU UNIVERSITY, Zhenjiang (CN)

(72) Inventors: Biao Chen, Zhenjiang (CN); Haobin Jiang, Zhenjiang (CN); Huayang Sun, Zhenjiang (CN); Huanhuan Li, Zhenjiang (CN); Lei Hua, Zhenjiang (CN)

(73) Assignee: JIANGSU UNIVERSITY, Zhenjiang (CN)

( * ) Notice: Subject to any disclaimer, the term of this patent is extended or adjusted under 35 U.S.C. 154(b) by 0 days.

(21) Appl. No.: 16/965,062

(22) PCT Filed: Mar. 29, 2019

(86) PCT No.: PCT/CN2019/080284
§ 371 (c)(1),
(2) Date: Jul. 27, 2020

(87) PCT Pub. No.: WO2020/186550
PCT Pub. Date: Sep. 24, 2020

(65) Prior Publication Data
US 2021/0405119 A1  Dec. 30, 2021

(30) Foreign Application Priority Data

Mar. 21, 2019 (CN) .......................... 201910217008.6

(51) Int. Cl.
*G01R 31/367* (2019.01)
*G01R 31/374* (2019.01)
*G01R 31/36* (2020.01)

(52) U.S. Cl.
CPC ......... *G01R 31/367* (2019.01); *G01R 31/374* (2019.01); *G01R 31/3648* (2013.01)

(58) Field of Classification Search
CPC . G01R 31/367; G01R 31/374; G01R 31/3648
See application file for complete search history.

(56) References Cited

U.S. PATENT DOCUMENTS 7,109,685 B2  9/2006  Tate, Jr.
10,302,704 B2 *  5/2019  Hariharan ............ G01R 31/367
(Continued)

FOREIGN PATENT DOCUMENTS

| CN | 103293485 A | 9/2013 |
|----|-------------|--------|
| CN | 108169682 A | 6/2018 |
| CN | 109884528 A | 6/2019 |

OTHER PUBLICATIONS

Gong et al., "Life prediction of lithium ion batteries for electric vehicles based on gas production behavior model" 2017 International Conference on Sensing, Diagnostics, Prognostics, and Control (Year: 2017).*

*Primary Examiner* — John C Kuan
(74) *Attorney, Agent, or Firm* — Renner, Otto, Boisselle & Sklar, LLP

(57) ABSTRACT

A method and device for estimating an open circuit voltage of a battery based on a gas-liquid dynamic model, includes the following steps: deriving an undetermined equation for estimating the open circuit voltage according to a gas-liquid dynamic model; identifying the estimation equation parameters according to experimental data; designing a method for estimating the open circuit voltage according to the complete equation for estimating open circuit voltage and calculating to obtain an estimated value of the open circuit voltage. The estimation equation of open circuit voltage includes the battery temperature. The experimental data includes open circuit voltages under different currents, ter- (Continued)

minal voltages and temperatures, optimal values of undetermined parameters of the equation for estimating open circuit voltage are identified with an identification method, and the optimal values of undetermined parameters are substituted into the undetermined equation for estimating open circuit voltage in the deriving step to obtain a complete equation.

6 Claims, 6 Drawing Sheets

(56) References Cited

U.S. PATENT DOCUMENTS

2014/0167656 A1* 6/2014 Yamada ............. G01R 31/3842
　　　　　　　　　　　　　　　　　　318/139
2020/0158783 A1　　5/2020　Chen

* cited by examiner

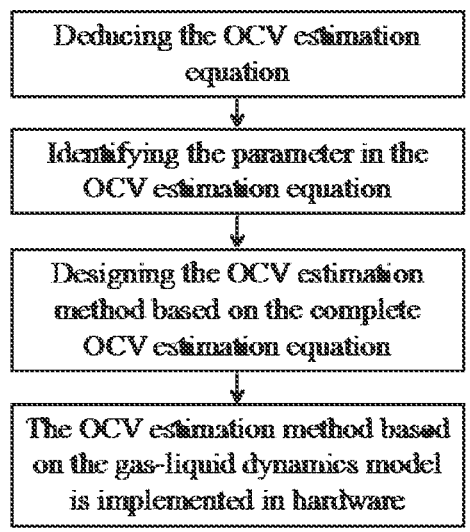
Figure 1
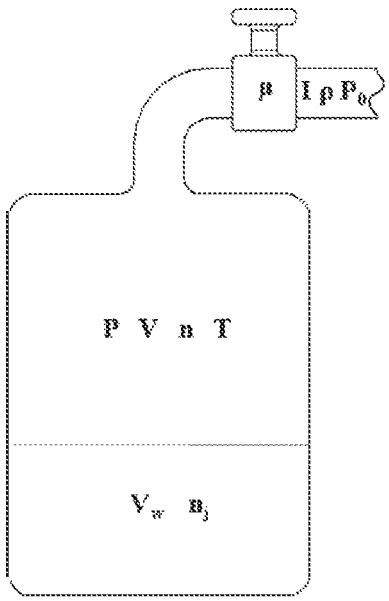
Figure 2
| Battery type | LFP battery | NCM battery | LTO battery | VRLA battery | Ni/MH battery | Ni/Cd battery |
|---|---|---|---|---|---|---|
| Discharge cut-off voltage (V) | 2.5 | 2.75 | 1.75 | 1.5 | 0.9 | 1.0 |
| Charge cut-off voltage (V) | 3.65 | 4.2 | 2.7 | 2.4 | 1.4 | 1.45 |
Figure 3

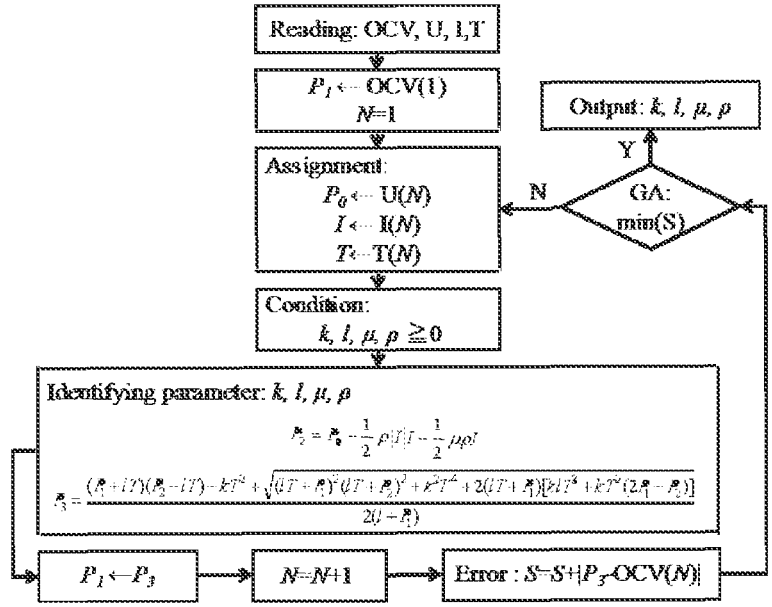
Figure 4
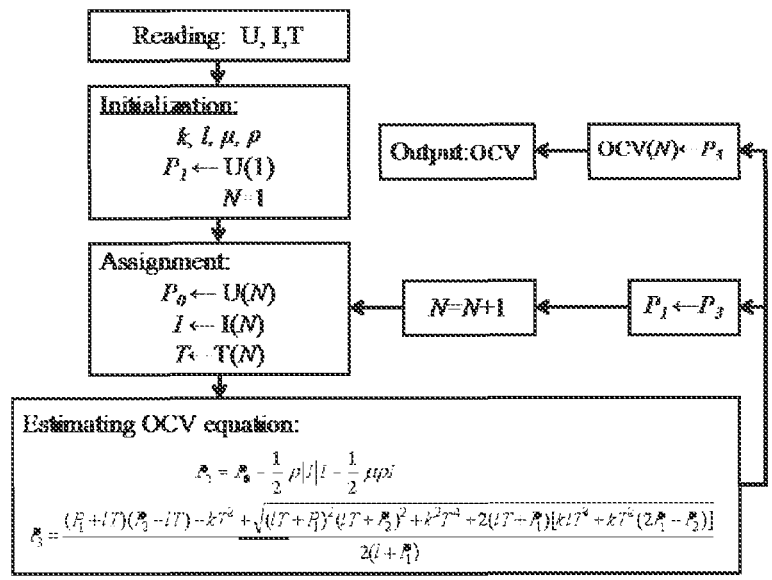
Figure 5
Figure 6

METHOD AND DEVICE FOR ESTIMATING OPEN CIRCUIT VOLTAGE OF BATTERY BASED ON A GAS-LIQUID DYNAMIC MODEL

TECHNICAL FIELD

This patent relates to the field of battery management systems and specifically, it is a method and device for estimating open circuit voltage of battery based on a gas-liquid dynamic model.

BACKGROUND ART

Oil is known as black gold and the blood of industry, but oil resources will gradually dry up with the continuous exploitation of human beings. Transportation accounts for nearly half of the total oil consumption and countries around the world are trying to find alternative energy sources. Among them, vigorously developing electric vehicle technology is one of the important choices. However, some important performance parameters of vehicle mounted lithium battery have changed greatly due to the increase of discharge depth, the decrease of internal active substances, the increase of EIS film thickness internal resistance, reversible capacity attenuation and the change of ambient temperature. At present, there are many problems in the battery model, such as complex model and unstable parameter changes, which lead to the inaccuracy of OCV (open circuit voltage) estimation and the uncertainty of the remaining mileage. Therefore, it is of great significance to establish an accurate battery model.

Now, the most studied analytical models are equivalent circuit model and electrochemical model. The electrochemical model studies the charge discharge process from the essence of the battery, which describes the macro (such as voltage, current, resistance, etc.) and micro (ion concentration distribution, transmission, etc.) information related to battery design parameters through state equation, differential equation and partial differential equation. Although it is accurate, it is difficult to be used in real-time estimation of vehicle MCU due to its huge complexity and time-consuming calculation. The equivalent circuit model studies the charging and discharging process of the battery from the perspective of the external characteristics. The electronic components can directly describe the charging and discharging process, such as capacitance, resistance and ideal power supply, and its state equations are simpler than the electrochemical model. The equivalent circuit model has many forms and structures, such as Rint model, Thevenin model, PNGV, n-RC model and so on. Among them, Rint model is very simple, but the accuracy of SOC estimation is unsatisfactory. On the contrary, blindly pursuing precision will produce more uncertain parameters to be identified, such as the third-order RC equivalent circuit model. In addition, in order to ensure the accuracy of estimation in the whole SOC process, the equivalent circuit models are often combined with intelligent algorithm, such as sliding film algorithm, fuzzy logic algorithm, simulated annealing algorithm, particle swarm optimization algorithm, Kalman filter or its variant algorithm. However, the intelligent algorithm needs a lot of computation, which makes the model difficult to realize real-time estimation on the vehicle MCU.

All in all, only relying on the existing battery model cannot meet the requirements of practical application, so it is urgent to develop a more accurate model, open circuit voltage estimation method and device which can describe the nonlinear process of battery in charging and discharging, reflect the temperature characteristics of battery, and have simple analytical formula and small calculation.

CONTENTS OF THE INVENTION

In order to solve above problems, this patent provides a method and device for estimating battery open circuit voltage based on a gas-liquid dynamic model. The estimation equations of open circuit voltage include the battery temperature instead coupling battery temperature in this invention, which simplifies the estimation process of open circuit voltage; In the estimation equation, the principle of gas dissolution/precipitation is equivalent to the polarization effect of the battery, which can better fit the phenomenon of open circuit voltage lagging behind the battery terminal voltage; The estimation result of the estimation equation does not depend on the accuracy of the input initial value, which has excellent estimation robustness; it can more accurately describe the nonlinear process of battery in charging and discharging, simple analytical formula, easy parameter identification and small calculation, and reflect the influence of battery temperature characteristics on the open circuit voltage, which is easy to realize in engineering.

The technical scheme adopted by the invention to solve the technical problem is as follows:

A method for estimating battery open circuit voltage based on a gas-liquid dynamic model includes the following steps:

step 1: deriving an undetermined equation for estimating open circuit voltage on the basis of a gas-liquid dynamic model;

step 2: identifying parameters of the estimation equation on the basis of experimental data: open circuit voltages under different currents, terminal voltages and temperatures are obtained through experimental tests, optimal values of undetermined parameters of the equation for estimating open circuit voltage are identified with an identification method, and the optimal values of undetermined parameters are substituted into the undetermined equation for estimating open circuit voltage in the step 1 to obtain a complete equation for estimating open circuit voltage;

step 3: designing a method for estimating open circuit voltage on the basis of the complete equation for estimating open circuit voltage, and calculating to obtain an estimated value of open circuit voltage.

In the above scheme, the equation for estimating open circuit voltage in the step 1 is:

$$P_3 = \frac{(P_1 + lT)(P_2 - lT) - kT^2 +}{\sqrt{\frac{(lT + P_1)^2(lT + P_2)^2 + k^2T^4 + 2(lT + P_1)[klT^3 + kT^2(2P_1 - P_2)]}{2(l + P_1)}}}$$ Equation 1

Wherein, $P_2 = P_0 - \frac{1}{2}\rho|I|I - \frac{1}{2}\mu\rho I$      Equation 2

$P_0$, I and $P_1$ represent terminal voltage, current and open circuit voltage respectively, $P_3$ represents the open circuit voltage to be estimated, T represents battery temperature, $\rho$ represents density of gas flow, $\mu$ represents resistance coefficient of gas flow, k represents first equivalent parameter, l represents second equivalent parameter, $P_0$ represents orifice pressure; $P_2$ represents gas pressure in the container during the exhausting or inflating process in the gas-liquid dynamic model.

In the above scheme, the specific process of identifying the parameters of the estimation equation in the step 2 is as follows:
(1) reading data of open circuit voltage OCV, terminal voltage U, current I, and temperature T;
(2) assigning an initial value to $P_1$ in the OCV estimation equation, i.e., $P_1$=OCV(1), and assuming N=1;
(3) assigning values, $P_0$=U(N), I=I(N), T=T(N);
(4) assuming the parameters k, l, ρ and μ to be identified to be greater than or equal to 0;
(5) putting into the undetermined equation for estimating open circuit voltage;
(6) updating the initial values of $P_1$ and N, i.e., $P_1$=$P_3$, N=N+1;
(7) using an estimation total error S=S+|$P_3$−OCV(N)| as an objective function;
(8) determining a criterion for termination condition until S does not decrease anymore;
(9) repeating the above steps (3)-(8) until the end of parameter identification, and outputting optimal values of parameters k, l, ρ and μ.

In the above scheme, the specific process of the step 3 is as follows:
(1) reading data of terminal voltage U, current I, and temperature T;
(2) assigning an initial value to $P_1$ in the complete equation for estimating open circuit voltage, i.e., $P_1$=OCV(1), and setting N=1;
(3) assigning values, $P_0$=U(N), I=I(N), T=T(N);
(4) putting the values into the complete equation for estimating open circuit voltage;
(5) updating the initial values of $P_1$ and N, and outputting an estimated value of open circuit voltage;
(6) repeating the steps (3)-(5) until the end of open circuit voltage estimation.

In the above scheme, the identification method is a genetic algorithm, particle swarm algorithm, simulated annealing algorithm, ant colony algorithm, support vector machine method, neural network algorithm or least square method.

An apparatus for realizing the method for estimating open circuit voltage of battery based on a gas-liquid dynamic model, it comprises a signal acquisition component, an estimation component for open circuit voltage, and a display component;
the signal acquisition component is configured to acquire the current, temperature and voltage of the battery;
the signal acquisition component is connected with the estimation component for open circuit voltage and transmits the acquired signals of current, temperature and voltage to the estimation component for open circuit voltage, and the estimation component for open circuit voltage calculates a value of open circuit voltage according to the equation for estimating open circuit voltage;
the estimation component for open circuit voltage is connected with the display component, and transmits values of the current, temperature, voltage, and open circuit voltage of the battery to the display component for display.

In the above scheme, the signal acquisition component comprises a current sensor, a temperature sensor and a voltage sensor;
the current sensor is configured to detect the current of the battery;
the temperature sensor is configured to detect the temperature of the battery;
the voltage sensor is configured to detect the voltage of the battery.

In the above scheme, the estimation component for open circuit voltage comprises a single chip microcomputer.

Compared with the present technologies, the benefits of the present invention are as follows:
1. The OCV estimation equation of the invention is simple, decoupled with time, less computation, eliminating error through iteration, high estimation accuracy, and can realize real-time estimation of open circuit voltage on a single-chip microcomputer.
2. The temperature of the invention is the input of OCV estimation equation, like as same as terminal voltage and current, instead introducing temperature compensation coefficient or empirical formula, which reduces the difficulty of parameter identification and improves the robustness of OCV estimation.
3. The gas-liquid dynamic model of the invention is simple, intuitive and easy to understand, and reflects the characteristics of the battery terminal voltage lagging open circuit voltage.

DESCRIPTION OF DRAWINGS

This above and/or additional aspects and advantages of the present invention will become clear and easy to understood from the following figures:
FIG. 1: Flow chart of the invention.
FIG. 2: The gas-liquid dynamics physical model figure.
FIG. 3: Common secondary battery charging and discharging cut-off voltage.
FIG. 4: The flowchart of parameter identification of this invention.
FIG. 5: The value of parameters undetermined in the open circuit voltage estimation equation.
FIG. 6: The flow chart of OCV estimation.

EMBODIMENTS

Figure 7:
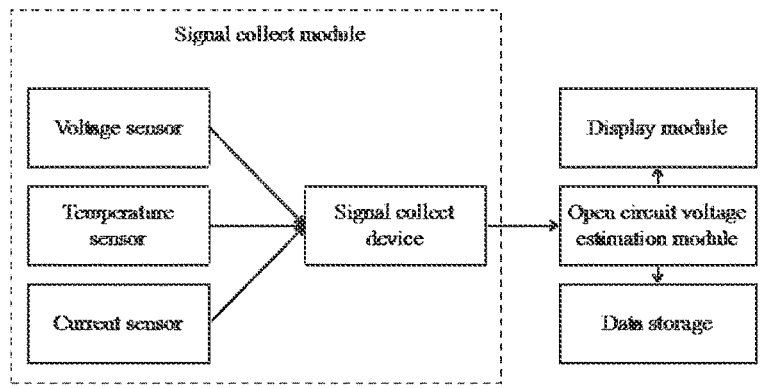
FIG. 7: Block diagram of OCV estimation device.

The implementation of the present invention is described in detail below, and the examples of implementation are illustrated in the attached figures, wherein the same or similar reference numerals are used to refer to the same or similar elements or elements which have the same or similar functions. The implementation example described below with reference to the attached figures is intended to be illustrative of the invention and is not to be construed as the limitation of this invention.

In the description of this invention, it is to be understood that the terms "center", "longitudinal", "transverse", "length", "width", "thickness", "upper", "lower", "axial", "radial", "vertical", "horizontal", "inside" and "outside", which indicate the orientation or positional relationship, are based on the orientation or positional relationship shown in the attached figures. Rather than indicating or implying that the device or component must have a particular orientation, the construction and operation in a particular orientation, these terms are used for the convenience of describing the present invention and simplifying the description and are not to be construed as the limitation of this invention. Moreover, the terms "first" and "second" are used for descriptive purposes only and are not to be understood as indicating or implying a relative importance or implicitly indicating the number of technical features. Therefore, features defining "first" or "second" may include one or more of the features, either explicitly or implicitly. In the description of this invention, the meaning of "a plurality" is two or more unless it is specifically defined.

In this invention, the terms "installation", "connected", "fixed", etc., should be understood broadly unless they are specifically defined or limited. For example, 'connected' may be a fixed connection, a detachable connection, an integral connection, a mechanical connection, an electrical connection, directly connected, indirectly connected through an intermediate medium, or may be internal to both components. For those skilled in the related industry, the specific meanings of the above terms in this invention can be understood on a case-by-case basis.

FIG. 1 shows an embodiment of a method for estimating battery open circuit voltage based on a gas-liquid dynamic model according to the present invention, said method for estimating battery open circuit voltage based on a gas-liquid dynamic model comprises the following steps:

Step 1: deriving an undetermined equation for estimating open circuit voltage on the basis of a gas-liquid dynamic model;

As shown in FIG. 2, a physical prototype of the gas-liquid dynamic model is a sealed container provided with a gas-liquid coexistence system, and the container contains a compressed gas with volume of V, pressure of P amount of substance of n and average temperature of T and a liquid with volume of $V_w$, wherein $n_j$ represents the amount of the substance of gas dissolved in the liquid; a bent pipe and an openable valve are provided at the top of the container; if the valve is opened, the gas in the container can be released or an external gas can be pumped into the container; μ and ρ represent comprehensive resistance coefficient and density in the pipe during the gas flow process respectively, and I and $P_0$ represent gas flow rate and orifice pressure respectively.

$$P_3 = \frac{(P_1+lT)(P_2-lT)-kT^2+}{\sqrt{\frac{(lT+P_1)^2(lT+P_2)^2+k^2T^4+2(lT+P_1)[klT^3+kT^2(2P_1-P_2)]}{2(l+P_1)}}} \quad \text{Equation 1}$$

$$\text{Wherein, } P_2 = P_0 - \frac{1}{2}\rho|I|I - \frac{1}{2}\mu\rho I \quad \text{Equation 2}$$

Charging current is positive, and discharging current is negative;

The state equations of the gas-liquid dynamic model include: the ideal gas state equation, the gas dissolution equilibrium equation, and the Bernoulli equation;

Wherein, $P_0$, I and $P_1$ represent orifice pressure, gas flow rate, and gas pressure in the container under steady state in the gas-liquid dynamic model respectively, and correspond to terminal voltage, current, and open circuit voltage in the battery respectively; $P_3$ represents pressure to be estimated in the container under steady state in the gas-liquid dynamic model, and represents the open circuit voltage to be estimated in the battery; T represent gas temperature in the container in the gas-liquid dynamic model, and represents battery temperature in the battery; ρ represents the density of gas flow; μ represents the resistance coefficient of gas flow; k represents the first equivalent parameter; l represents the second equivalent parameter; $P_0$ represents the orifice pressure; $P_2$ represents the gas pressure in the container during the exhausting or inflating process in the gas-liquid dynamic model;

The specific process of the step 1 is as follows:
the ideal gas state equation is:

$$P_2 V = n_2 RT \quad \text{Equation 3}$$

$$P_3 V = n_3 RT \quad \text{Equation 4}$$

Gas solution equilibrium equation is:

$$n_{j1} = \frac{P_1 \varphi_m V_w}{RT + b_m P_1} \quad \text{Equation 5}$$

$$n_{j3} = \frac{P_3 \varphi_m V_w}{RT + b_m P_3} \quad \text{Equation 6}$$

Where, $P_1$: gas pressure in the container under steady state, $P_2$: gas pressure in the container during the exhausting or inflating process, $P_3$: pressure to be estimated in the container under steady state, $n_2$: amount of substance of gas in the container during the exhausting or inflating process, $n_3$: amount of the substance of gas to be estimated in the container under steady state, T: gas temperature in the container, V: gas volume, R: thermodynamic constant, $V_W$: liquid volume, $b_m$: Van der Waals volume of gas molecule, $\varphi_m$: effective clearance degree, $n_{j1}$: amount of substance of gas dissolved in the liquid under steady state, $n_{j3}$: amount of substance of gas dissolved in the liquid under steady state, which is to be estimated;

Wherein the amounts of substance, $n_2$, $n_3$, $n_{j1}$ and $n_{j3}$, should meet the following control relationship:

$$n_3 = n_2 + n_{j1} - n_3 \quad \text{Equation 7}$$

Wherein the following equation is derived from the equations 3-7:

$$P_3 - P_2 = \frac{RT}{V}(n_3 - n_2) =$$

$$\frac{RT}{V}(n_{j1} - n_{j3}) = \frac{RT\varphi_m V_w}{V}\left(\frac{P_1}{RT+b_m P_1} - \frac{P_3}{RT+b_m P_3}\right) \quad \text{Equation 8}$$

The equation 8 is simplified to:

$$P_3 - P_2 = \frac{R^2 \varphi_m V_w T^2}{V b_m^2} \times \left(\frac{1}{\frac{RT}{b_m}+P_3} - \frac{1}{\frac{RT}{b_m}+P_1}\right) \quad \text{Equation 9}$$

Assuming:

$$k = \frac{R^2 \varphi_m V_w}{V b_m^2}, \, l = \frac{R}{b_m} \quad \text{Equation 10}$$

The above equation is sorted out to obtain an equation 11, which is a quadratic equation of $P_3$:

$$P_3^2 + P_3\left(lT + \frac{kT^2}{lT + P_1} - P_2\right) + \left(\frac{klT^3}{lT + P_1} - P_2lT - kT^2\right) = 0 \quad \text{Equation 11}$$

Assuming:

$$a = 1, b = lt + \frac{kT^2}{lT + P_1} - P_2, c = \frac{klT^3}{lT + P_1} - P_2lT - kT^2 \quad \text{Equation 12}$$

$$\Delta = \frac{(lT + P_1)^2(lT + P_2)^2 + k^2T^4 + 2kT^2(lT + P_1)(lT + 2P_1 - P_2)}{(lT + P_1)^2} \quad \text{Equation 13}$$

$$ac = -\frac{P_2l^2T^2 + P_1P_2lT + P_1kT^2}{lT + P_1} \quad \text{Equation 14}$$

In consideration of the actual physical significance of the battery, two voltage values are taken randomly in a secondary battery charging/discharging window, wherein doubled voltage value is surely greater than the single voltage value, as shown in FIG. 3, $2P_1 - P_2 > 0$; besides, since all physical quantities are greater than zero, $\Delta > 0$, $ac < 0$ is always true; according to Vieta Theorem, the obtained quadratic equation, i.e., Equation 11, has and only has one positive real root, then:

$$P_3 = \frac{(P_1 + lT)(P_2 - lT) - kT^2 +}{\sqrt{\frac{(lT + P_1)^2(lT + P_2)^2 + k^2T^4 + 2(lT + P_1)[klT^3 + kT^2(2P_1 - P_2)]}{2(l + P_1)}}} \quad \text{Equation 1}$$

Bernoulli equation can be written during gas flow:

$$P_2 = P_0 - \tfrac{1}{2}\rho|I|I - \tfrac{1}{2}\mu\rho I \quad \text{Equation 2}$$

The equation 1 and the equation 2 are the equations for estimating the open circuit voltage, wherein charging current is positive and discharging current is negative;

Step 2: identifying parameters of the estimation equation on the basis of experimental data: there are four undetermined parameters in the equation for estimating open circuit voltage in the step 1, i.e., k, l, ρ and μ respectively. Open circuit voltages under different currents, terminal voltages, and temperatures are obtained by experimental test with a variable-rate and variable-temperature HPPC experiment, optimal values of the parameters k, l, ρ and μ in the equation for estimating open circuit voltage are identified by using the genetic algorithm to solve the optimal identification method, and the values of the parameters k, l, ρ and μ are substituted into the undetermined equation for estimating open circuit voltage in the step 1 to obtain a complete equation for estimating open circuit voltage; the identification process is shown in FIG. 4, and the identification result is shown in FIG. 5;

The specific process of identifying the parameters of the estimation equation in the step 2 is as follows:
(1) reading data of open circuit voltage OCV, terminal voltage U, current I, and temperature T;
(2) assigning an initial value to P in the OCV estimation equation, i.e., $P_1$=OCV(1), and assuming N=1;
(3) assigning values, $P_0$=U(N), I=I(N), T=T(N);
(4) assuming the parameters k, l, ρ and μ to be identified to be greater than or equal to 0;
(5) putting into the undetermined equation for estimating open circuit voltage;
(6) updating the initial values of $P_1$ and N, i.e., $P_1$=$P_3$, N=N+1;
(7) using an estimation total error S=S+$P_3$−OCV(N) as an objective function;
(8) determining a criterion for termination condition until the value of S does not decrease anymore;
(9) repeating the above steps (3)-(8) until the end of parameter identification, and outputting optimal values of parameters k, l, ρ and μ;

The identification method is genetic algorithm, particle swarm algorithm, simulated annealing algorithm, ant colony algorithm, support vector machine method, neural network algorithm or least square method. In this example, genetic algorithm is preferred.

Step 3: designing a method for estimating open circuit voltage on the basis of the complete equation for estimating open circuit voltage, and calculating to obtain an estimated value of open circuit voltage. As shown in FIG. 6, the specific process is as follows:
(1) reading data of terminal voltage U, current I, and temperature T;
(2) assigning an initial value to $P_1$ in the complete equation for estimating open circuit voltage, i.e., $P_1$=OCV(1), and setting N=1;
(3) assigning values, $P_0$=U(N), I=I(N), T=T(N);
(4) putting into the complete equation for estimating open circuit voltage;
(5) updating the initial values of $P_1$ and N, and outputting an estimated value of open circuit voltage;
(6) repeating the steps (3)-(5) until the end of open circuit voltage estimation.

As shown in FIG. 7, an apparatus for realizing the method for estimating open circuit voltage of the battery based on a gas-liquid dynamic model comprises a signal acquisition component, an estimation component for open circuit voltage, and a display component; the signal acquisition component is configured to acquire the current, temperature and voltage of the battery; the signal acquisition component is connected with the estimation component for open circuit voltage and transmits the acquired signals of current, temperature and voltage to the estimation component for open circuit voltage, and the estimation component for open circuit voltage calculates a value of open circuit voltage according to the equation for estimating open circuit voltage; the estimation component for open circuit voltage is connected with the display component, and transmits values of the current, temperature, voltage, and open circuit voltage of the battery to the display component for display.

The signal acquisition component comprises a current sensor, a temperature sensor and a voltage sensor.

The estimation component for open circuit voltage comprises a single chip microcomputer, which preferably is STM32. The battery OCV estimation method based on a gas-liquid dynamic model can be realized on the hardware, and the codes written in C language on a Keil uVision5 development platform can be realized on the STM32 single chip microcomputer.

The estimation component for open circuit voltage is specifically implemented as follows:
first, a library function file for the STM32 single chip microcomputer is loaded, the registers of the STM32 single chip microcomputer are configured with the library functions, and then clock function, timer function, delay function, storage function, data check function, OCV estimation function and main function are written;

(1) The current sensor and temperature sensor are connected to a signal acquisition card which can directly acquire the voltage of individual battery cells. Preferably, the voltage of the single battery is in a range of 0-5V;
(2) The acquisition card is connected to a serial port of the STM single chip microcomputer, the communication mode is selected as RS-232 to transmit the current, voltage and temperature signals of the battery to the single chip microcomputer;
(3) The main function of the STM32 single chip microcomputer reads the signals of current, voltage and temperature of the battery, and the OCV estimation function is invoked to calculate the value of open circuit voltage under the current input; the current, voltage and temperature and the calculated value of open circuit voltage of the battery are written into the memory card, and are transmitted to the display component of a host computer for display;
(4) The steps (1)-(3) are repeated, to complete real-time estimation of open circuit voltage of the battery.

The host computer is developed based on the Microsoft Visual Studio platform, and is used to display the terminal voltage and open circuit voltage of the battery pack, the open circuit voltage of all serially connected individual battery cells, and fitting minimum open circuit voltage of the battery;

The single chip microcomputer comprises a $2^n$-bit single chip microcomputer (n=1, 2, 3, . . . ,) and various arithmetical units of ARM core;

The signal communication protocols used include: RS-485, CAN, TCP, Modbus, MPI, and serial port communication and so on.

Figure 8:
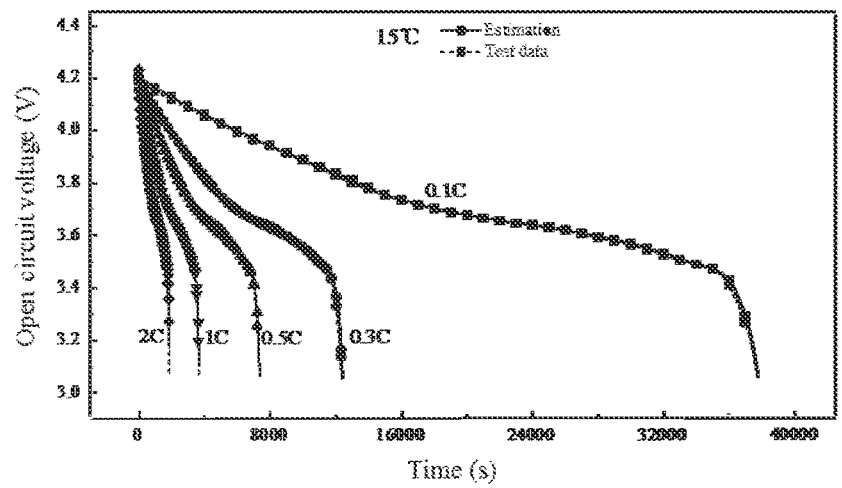
FIG. 8: Estimation results at 15° C.
Figure 9:
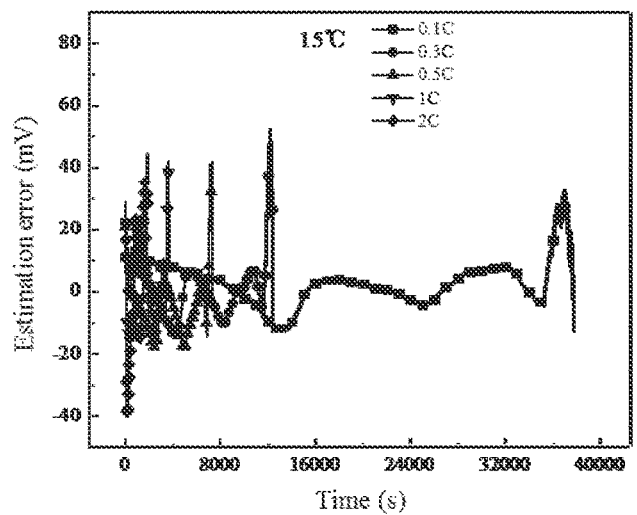
FIG. 9: Estimation errors at 15° C.
Figure 10:
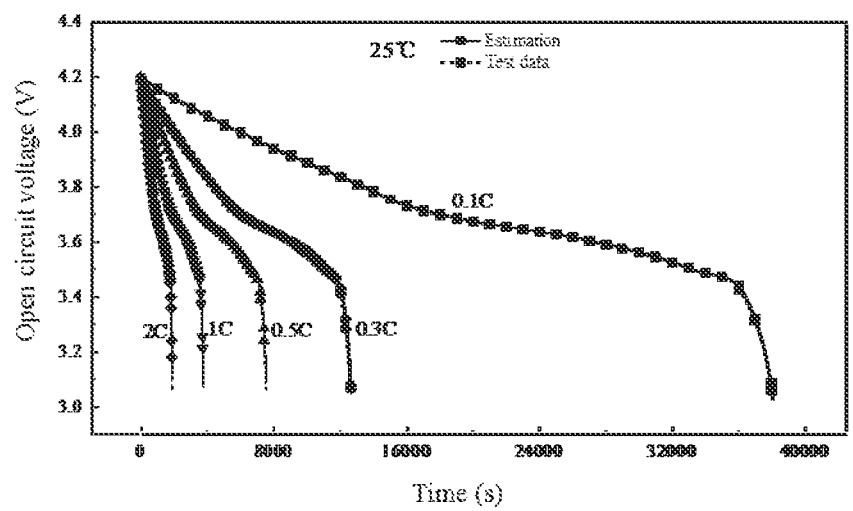
FIG. 10: Estimation results at 25° C.
Figure 11:
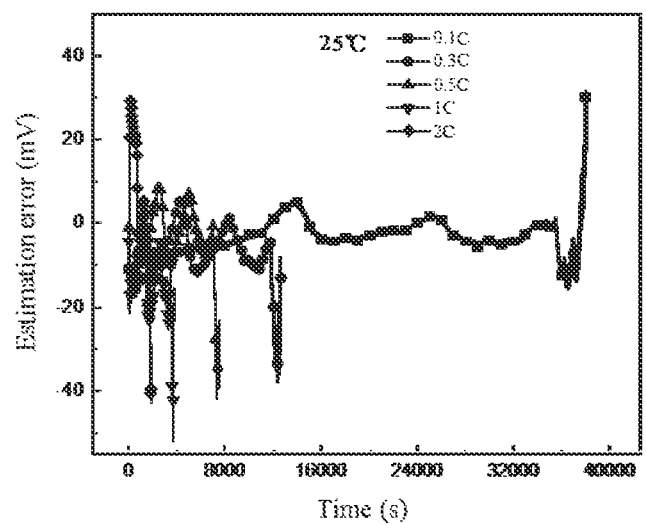
FIG. 11: Estimation errors at 25° C.
Figure 12:
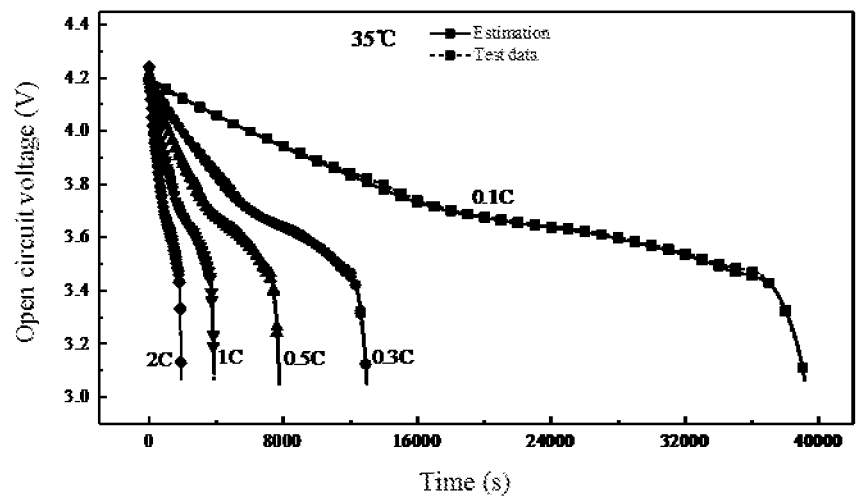
FIG. 12: Estimation results at 35° C.
Figure 13:
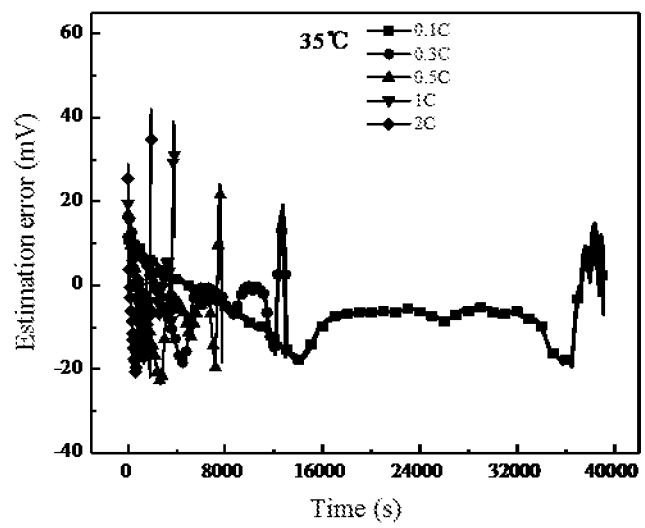
FIG. 13: Estimation errors at 35° C.
Figure 14:
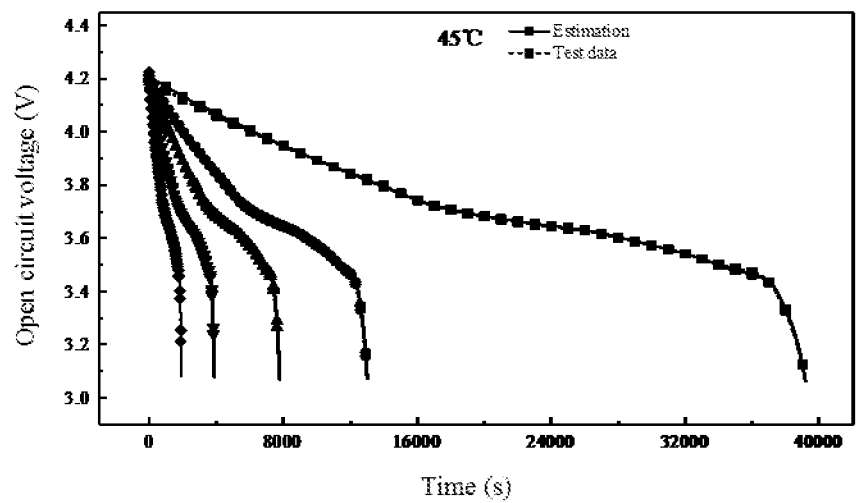
FIG. 14: Estimation results at 45° C.
Figure 15:
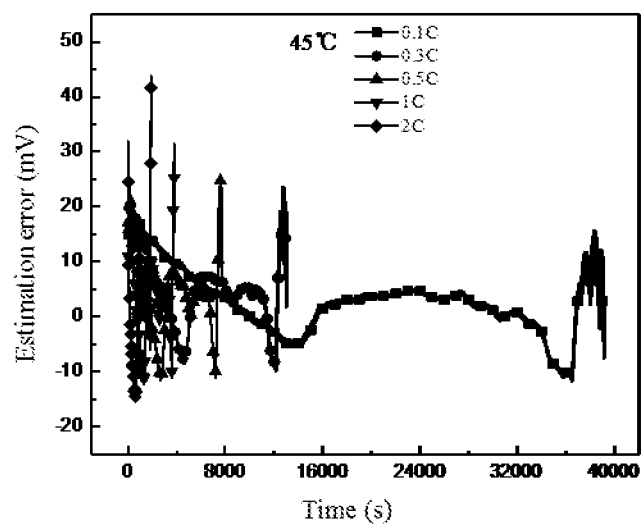
FIG. 15: Estimation errors at 45° C.

The normal working temperature of the battery for electric vehicle is 15° C. to 45° C. The present invention selects 15° C. as the starting temperature, and the estimation results are verified at rates of 0.1 C, 0.3 C, 0.5 C, 1 C and 2 C at intervals of 10° C., as shown in FIGS. 8-15. Wherein, FIG. 8 shows the estimation effect of the model under 15° C., and shows that the estimation curve and the experimental curve basically coincide; FIG. 9 shows the estimation error corresponding to FIG. 8, and shows that the estimation errors at each rate after equilibrium are within a range of ±20 mV, except at the end of time, so the requirements for real vehicle application can be met; FIG. 10 shows the estimation effect of the model under 25° C., and shows that the estimation curve and the experimental curve basically coincide; FIG. 11 shows the estimation error corresponding to FIG. 10, and shows that the estimation errors at each rate after equilibrium are within a range of ±20 mV except at the end of time, so the requirements for real vehicle application can be met; FIG. 12 shows the estimation effect of the model under 35° C., and shows that the estimation curve and the experimental curve basically coincide; FIG. 13 shows the estimation error corresponding to FIG. 12, and shows that the estimation errors at each rate after equilibrium are within a range of ±20 mV except at the end of time, so the requirements for real vehicle application can be met; FIG. 14 shows the estimation effect of the model under 45° C., and shows that the estimation curve and the experimental curve basically coincide; FIG. 15 shows the estimation error corresponding to FIG. 14, and shows that the estimation errors at each rate after equilibrium are within a range of ±20 mV except at the end of time, so the requirements for real vehicle application can be met.

It should be understood that, although the present invention is described in terms of various examples, each example should not be deemed as including only one independent technical scheme. The expression mode of the description is only for the purpose of clarity and the person skilled in the art should take the description as a whole. The technical solutions in examples may be appropriately combined to form other embodiments which can be understood by the person skilled in the art.

The above series of detailed description are merely specific descriptions of some possible examples of the present invention, and are not intended to limit the protection scope of the present invention. Any equivalent embodiment or modification made without departing from the spirit of the present invention should be deemed as falling in the protection scope of the present invention.

The invention claimed is:

1. A method for estimating an open circuit voltage of a battery based on a gas-liquid dynamic model, the method comprising the following steps:

step 1: deriving an undetermined equation for estimating the open circuit voltage on the basis of the gas-liquid dynamic model, and embedding the undetermined equation for estimating the open circuit voltage into a single chip microcomputer of an estimation component for the open circuit voltage;

step 2: identifying parameters of the undetermined equation for estimating the open circuit voltage on the basis of experimental data: open circuit voltages under different currents, terminal voltages and temperatures obtained through experimental tests, identifying optimal values of undetermined parameters with an identification method, and substituting the optimal values of undetermined parameters into the undetermined equation for estimating the open circuit voltage to obtain a complete equation for estimating the open circuit voltage; and step 3: acquiring signals of current, temperature, and voltage of the battery through a signal acquisition component, which transmits the acquired signals of current, temperature, and voltage to the single chip microcomputer of the estimation component for the open circuit voltage, the single chip microcomputer designing a process for estimating the open circuit voltage on the basis of the complete equation for estimating the open circuit voltage, and calculating to obtain an estimated value of the open circuit voltage;

wherein the undetermined equation for estimating the open circuit voltage in the step 1 is:

$$P_3 = \frac{(P_1 + lT)(P_2 - lT) - kT^2 +}{\sqrt{\frac{(lT + P_1)^2(lT + P_2)^2 + k^2T^4 + 2(lT + P_1)[klT^3 + kT^2(2P_1 - P_2)]}{2(l + P_1)}}} \quad \text{Equation 1}$$

$$\text{wherein, } P_2 = P_0 - \frac{1}{2}\rho|I|I - \frac{1}{2}\mu\rho I \quad \text{Equation 2}$$

$P_0$, I, and $P_1$ represent terminal voltage, current, and open circuit voltage, respectively, $P_3$ represents the open circuit voltage to be estimated, T represents battery temperature, ρ represents density of gas flow, μ represents resistance coefficient of gas flow, k represents a first equivalent parameter, l represents a second equivalent parameter, $P_0$ represents an orifice pressure; and $P_2$ represents gas pressure in a container during an exhausting or inflating process in the gas-liquid dynamic model.

2. The method for estimating the open circuit voltage of the battery based on the gas-liquid dynamic model according to claim 1, wherein, the specific process of identifying the parameters of the undetermined equation for estimating the open circuit voltage the step 2 includes the steps of:
(1) reading data of open circuit voltage OCV, terminal voltage U, current I, and temperature T;
(2) assigning an initial value to $P_1$ in the undetermined equation for estimating the open circuit voltage as $P_1$=OCV(1), and assuming N=1;
(3) assigning values, $P_0$=U(N), I=I(N),T=T(N);
(4) assuming the parameters k, l, ρ and μ to be identified to be greater than or equal to 0;
(5) inserting the assigned values of $P_0$, I, and T into the undetermined equation for estimating open circuit voltage;
(6) updating the initial values of $P_1$ and N, $P_1$=$P_3$, N=N+1;
(7) using an estimation total error S=S+|$P_3$−OCV(N)| as an objective function;
(8) determining a criterion for a termination condition until S does not decrease anymore; and
(9) repeating the above steps (3)-(8) until an ending criterion of parameter identification is satisfied, and outputting optimal values of parameters k, l, ρ and μ.

3. The method for estimating the open circuit voltage of the battery based on the gas-liquid dynamic model according to claim 1, wherein, the specific process of the step 3 is as follows:
(1) reading data of terminal voltage U, current I, and temperature T;
(2) assigning an initial value to $P_1$ in the complete equation for estimating the open circuit voltage, as $P_1$=OCV(1), and setting N=1;
(3) assigning values, $P_0$=U(N),I=I(N),T=T(N);
(4) putting the assigned values of P0, I, and T into the complete equation for estimating open circuit voltage;
(5) updating the initial values of $P_1$ and N, and outputting an estimated value of open circuit voltage; and
(6) repeating the steps (3)-(5) until an ending criterion of open circuit voltage estimation is satisfied.

4. The method for estimating the open circuit voltage of the battery based on the gas-liquid dynamic model according to claim 1, wherein in step 2 the identification method is a genetic algorithm, particle swarm algorithm, simulated annealing algorithm, ant colony algorithm, support vector machine method, neural network algorithm, or least square method.

5. An apparatus configured for estimating open circuit voltage of a battery based on a gas-liquid dynamic model, the apparatus comprising a signal acquisition component, an estimation component for open circuit voltage, and a display component; wherein:

the signal acquisition component is configured to acquire signals of current, temperature, and voltage of the battery; the signal acquisition component includes a current sensor, a temperature sensor, and a voltage sensor; the current sensor is configured to detect the current of the battery; the temperature sensor is configured to detect the temperature of the battery; the voltage sensor is configured to detect the voltage of the battery;

the signal acquisition component is connected with the estimation component for open circuit voltage and transmits the acquired signals of current, temperature, and voltage to the estimation component for the open circuit voltage, and the estimation component for the open circuit voltage designs a process of estimating the open circuit voltage according to an undetermined equation for estimating open circuit voltage, calculates and obtains an estimation value of the open circuit voltage on the basis of a complete equation for estimating the open circuit voltage; and the estimation component for open circuit voltage is connected with the display component, and transmits values of the acquired signals of the current, temperature, voltage, and the estimation value of the open circuit voltage of the battery to the display component for display;

wherein the undetermined equation for estimating open circuit voltage is:

$$P_3 = \frac{\left( \begin{array}{c} (P_1 + lT)(P_2 - lT) - kT^2 + \\ \sqrt{\begin{array}{c}(lT + P_2)^2(lT + P_2)^2 + k^2T^4 + \\ 2(lT + P_1)[klT^3 + kT^2(2P_1 - P_2)]\end{array}} \end{array} \right)}{2(l + P_1)} \quad \text{Equation 1}$$

wherein, $$P_2 = P_0 - \frac{1}{2}\rho|I|I - \frac{1}{2}\mu\rho I \quad \text{Equation 2}$$

and wherein $P_0$, I, and $P_1$ represent terminal voltage, current, and open circuit voltage, respectively, $P_3$ represents the open circuit voltage to be estimated, T represents battery temperature, ρ represents density of gas flow, μ represents resistance coefficient of gas flow, k represents a first equivalent parameter, l represents a second equivalent parameter, $P_0$ represents an orifice pressure; and $P_2$ represents gas pressure in a container during an exhausting or inflating process in the gas-liquid dynamic model.

6. The apparatus according to claim 5, wherein, the estimation component for open circuit voltage comprises a single chip microcomputer.

* * * * *